(12) United States Patent
Senda

(10) Patent No.: US 9,082,836 B2
(45) Date of Patent: Jul. 14, 2015

(54) FIELD EFFECT TRANSISTOR

(71) Applicant: Ryota Senda, Kanagawa-ken (JP)

(72) Inventor: Ryota Senda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 13/728,093

(22) Filed: Dec. 27, 2012

(65) Prior Publication Data

US 2013/0341680 A1 Dec. 26, 2013

(30) Foreign Application Priority Data

Jun. 20, 2012 (JP) .................................. 2012-138860

(51) Int. Cl.
| | |
|---|---|
| H01L 29/66 | (2006.01) |
| H01L 29/78 | (2006.01) |
| H01L 29/40 | (2006.01) |
| H01L 29/423 | (2006.01) |
| H01L 29/778 | (2006.01) |
| H01L 29/20 | (2006.01) |

(52) U.S. Cl.
CPC .............. *H01L 29/78* (2013.01); *H01L 29/402* (2013.01); *H01L 29/42316* (2013.01); *H01L 29/66462* (2013.01); *H01L 29/7787* (2013.01); *H01L 29/2003* (2013.01)

(58) Field of Classification Search
CPC .............. H01L 29/2003; H01L 29/402; H01L 29/7786; H01L 29/42364; H01L 29/517
USPC .......................................... 257/192, 194, 213
See application file for complete search history.

(56) References Cited

U.S. PATENT DOCUMENTS

| | | | | |
|---|---|---|---|---|
| 2007/0158692 A1* | 7/2007 | Nakayama et al. | ............ | 257/213 |
| 2007/0205433 A1* | 9/2007 | Parikh et al. | ................... | 257/192 |
| 2008/0237640 A1* | 10/2008 | Mishra et al. | ................. | 257/194 |
| 2009/0072272 A1* | 3/2009 | Suh et al. | ....................... | 257/194 |
| 2009/0146185 A1* | 6/2009 | Suh et al. | ....................... | 257/194 |

FOREIGN PATENT DOCUMENTS

| | | |
|---|---|---|
| JP | 2000-252299 A | 9/2000 |
| JP | WO2007/007589 A1 | 1/2007 |

(Continued)

OTHER PUBLICATIONS

Office Action issued Apr. 16, 2014 in Japanese Patent Application No. 2012-138860 (with English language translation).

(Continued)

*Primary Examiner* — Zandra Smith
*Assistant Examiner* — John M Parker
(74) *Attorney, Agent, or Firm* — Oblon, McClelland, Maier & Neudstadt, L.L.P.

(57) ABSTRACT

A field effect transistor includes a stacked body, a source electrode, a drain electrode, a gate electrode, a dielectric layer and a silicon nitride layer. The stacked layer has a heterojunction made of a nitride semiconductor. The source and drain electrodes are provided on a surface of the stacked body. The gate electrode is provided on the surface of the stacked body between the source and the drain electrodes, and has a field plate portion. The dielectric layer is provided so as to cover an intersection line of a first side surface of the gate electrode and the surface of the stacked body. The silicon nitride layer is provided so as to cover a region between the source electrode and the gate electrode and a region between the dielectric layer and the drain electrode. The field plate portion protrudes from the first side surface.

18 Claims, 10 Drawing Sheets

(56) References Cited

FOREIGN PATENT DOCUMENTS

| JP | 2007-129134 A | 5/2007 |
| JP | 2014-003222 A | 1/2014 |

OTHER PUBLICATIONS

Office Action issued Nov. 11, 2014 in Japanese Patent Application No. 2012-138860 (with English language translation).

* cited by examiner

FIELD EFFECT TRANSISTOR

CROSS-REFERENCE TO RELATED APPLICATIONS

This application is based upon and claims the benefit of priority from the prior Japanese Patent Application No. 2012-138860, filed on Jun. 20, 2012; the entire contents of which are incorporated herein by reference.

FIELD

Embodiments described herein relate generally to a field effect transistor.

BACKGROUND

A field effect transistor having a nitride heterojunction easily performs high-voltage and high-temperature operation in the microwave band or the higher frequency band, and can be used for mobile radio base stations, radar equipment, etc.

When an AlGaN layer is provided on a GaN layer serving as a channel layer, positive charges are generated at the heterojunction interface and negative polarization charges are generated at the AlGaN surface.

When large signal operation of a field effect transistor having such a structure is performed at microwave frequency, the current collapse phenomenon may occur in which the maximum drain current is decreased as compared to in direct current operation. Furthermore, in large signal operation, since the peak voltage of the gate electrode is higher than the direct current voltage, electric field concentration may occur at the semiconductor surface near the gate electrode and high-voltage operation may be suppressed.

DETAILED DESCRIPTION

In general, according to one embodiment, a field effect transistor includes a stacked body, a source electrode, a drain electrode, a gate electrode, a dielectric layer and a silicon nitride layer. The stacked layer has a heterojunction and is made of a nitride semiconductor. The source electrode is provided on a surface of the stacked body. The drain electrode is provided on the surface of the stacked body. The gate electrode is provided on the surface of the stacked body between the source electrode and the drain electrode, and has a field plate portion. The dielectric layer is provided so as to cover an intersection line of a first side surface of the gate electrode on the drain electrode side and the surface of the stacked body and has a relative permittivity higher than a relative permittivity of the surface of the stacked body. The silicon nitride layer is provided so as to cover a region between the source electrode and the gate electrode and a region between the dielectric layer and the drain electrode on the surface of the stacked body. The field plate portion protrudes from the first side surface of the gate electrode toward the drain electrode side above the silicon nitride layer.

Hereinbelow, embodiments of the invention are described with reference to the drawings.

Figure 1:
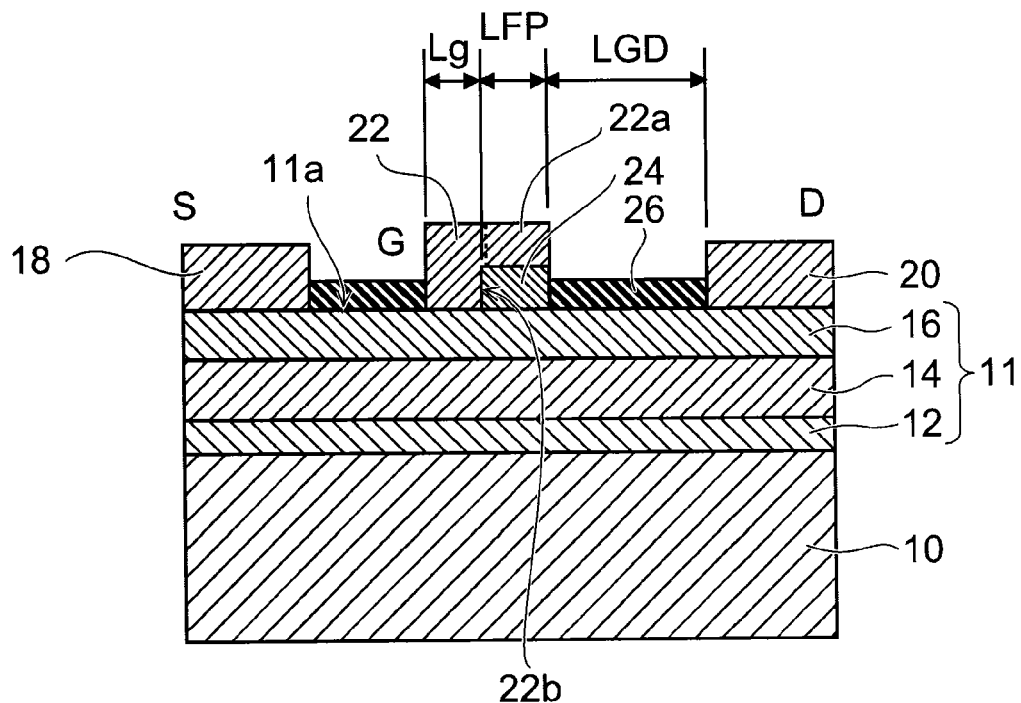
FIG. 1 is a schematic cross-sectional view of a field effect transistor according to a first embodiment.

FIG. 1 is a schematic cross-sectional view of a field effect transistor according to a first embodiment.

The field effect transistor (FET) includes a substrate 10 made of c-plane SiC or the like, a stacked body 11 provided on the substrate 10 and made of a nitride-based semiconductor, a source electrode 18, a gate electrode 22, a drain electrode 20, a silicon nitride film 26, and a dielectric layer 24.

The nitride-based semiconductor is expressed by the composition formula of $In_xGa_yAl_{1-x-y}N$ ($0 \le x \le 1$, $0 \le y \le 1$, $x+y \le 1$), and may contain an element serving as a donor or an acceptor.

The stacked body 11 includes a buffer layer 12 made of GaN or the like, a channel layer 14 provided on the buffer layer 12 and made of GaN or the like, and an electron supply layer 16 forming a heterojunction with the channel layer 14 and made of $Al_{0.2}Ga_{0.8}N$ or the like. The thickness of the buffer layer 12 may be, for example, in a range of 0.1 to 1 μm or the like. The thickness of the channel layer 14 may be, for example, in a range of 3 to 20 nm or the like. The thickness of the electron supply layer 16 may be, for example, 5 to 100 nm or the like. The channel layer 14 and the electron supply layer 16 may be non-doped.

Electrons that have moved from the electron supply layer 16 to the channel layer 14 form a two-dimensional electron gas, and may have high mobility and high density. Such a field effect transistor may be called a HEMT (high electron mobility transistor).

The source electrode 18 and the drain electrode 20 may be provided on the surface of the electron supply layer 16 constituting a surface 11a of the stacked body 11. The gate electrode 22 may be provided on the surface of the electron supply layer 16 between the source electrode 18 and the drain electrode 20. When the gate electrode 22 is made of Ni/Au, the Ni and the electron supply layer 16 constitute a Schottky barrier. By applying a control voltage to the gate electrode 22, the drain current can be controlled.

The gate length Lg may be, for example, 0.2 to 1 μm or the like, and the spacing LGD between a field plate portion 22a of the gate electrode 22 and the drain electrode 20 may be, for example, 1 to 5 μm or the like.

The gate electrode 22 has the field plate portion 22a protruding from a first side surface 22b of the gate electrode 22 toward the drain electrode 20 side above the silicon nitride layer 26.

The dielectric layer 24 is provided on the surface 11a of the stacked body 11, and is provided so as to cover the intersection line of the first side surface 22b of the gate electrode 22 on the drain electrode 20 side and the surface 11a of the stacked body 11. The relative permittivity of the dielectric layer 24 is set higher than the relative permittivity of the surface 11a of the stacked body 11. When the stacked body 11 is a nitride-based semiconductor, the relative permittivity is, for example, in a range of not less than 9 and not more than 10.

Figure 2:
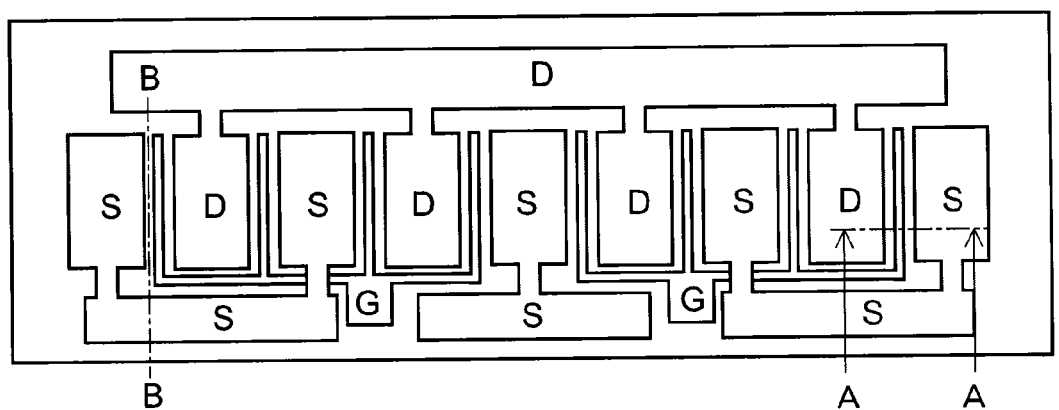
FIG. 2 is a schematic plan view of the field effect transistor of the first embodiment.

FIG. 2 is a schematic plan view of the field effect transistor of the first embodiment.

The schematic cross-sectional view of FIG. 1 is a cross section along line A-A. The gate electrode (G) 22 is provided substantially parallel to line B-B, a source electrode (S) extends substantially parallel to the gate electrode on one side of the gate electrode (G), and a drain electrode (D) extends substantially parallel to the gate electrode on the other side across the gate electrode.

A high amplified output power can be obtained by a configuration in which unit FET cells are connected in parallel as shown in FIG. 2. When the substrate 10 is semi-insulating, the three electrodes may be provided on the surface 11a of the stacked body 11.

When ohmic contact layers are provided individually between the source electrode 18 and the electron supply layer 16 and between the drain electrode 20 and the electron supply layer 16, the contact resistance can be more reduced. The source electrode 18 and the drain electrode 20 may be disposed in a recess provided in the stacked body 11.

GaN-based materials are likely to cause spontaneous polarization or piezoelectric polarization as compared to GaAs-based materials. Therefore, positive fixed charges are generated in the channel layer and negative polarization charges are generated at the surface of the electron supply layer. Due to the surface charges, the drain current in high-frequency large signal operation is decreased as compared to in direct current operation. This phenomenon is called current collapse. In particular, the peak drain voltage in microwave large amplitude operation may be approximately twice the direct current drain voltage, and the effect of current collapse is larger. In the first embodiment, by protecting the surface 11a of the stacked body 11 with the silicon nitride layer 26 having a large passivation effect, the effect of surface charge can be reduced. On the other hand, in an AlGaAs/GaAs-based heterojunction, the generation of polarization charge is limited and the effect of current collapse is small.

In the first embodiment, since the gate electrode 22 has the field plate portion 22a, the electric field concentration near the first side surface 22b on the drain side of the gate electrode 22 is relaxed and it is easy to increase the gate breakdown voltage. However, if the capacitance between the drain and the gate is too large, the gain is reduced. Therefore, the length LFP of the field plate portion 22a has an upper limit as viewed in the direction connecting the source electrode 18 and the drain electrode 20.

Figure 3A:
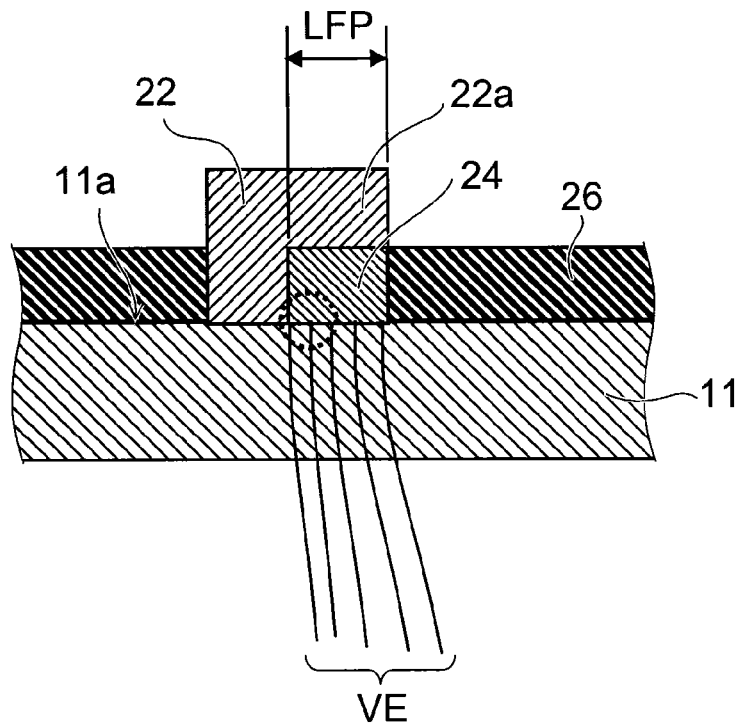
FIG. 3A is a schematic cross-sectional view describing the operation of the dielectric layer of the first embodiment.
Figure 3B:
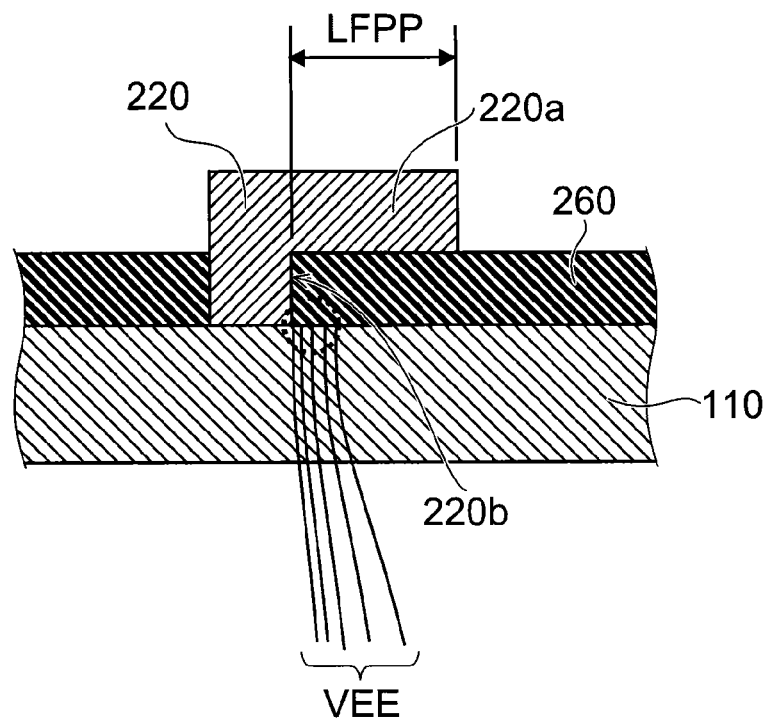
FIG. 3B is a schematic cross-sectional view of a comparative example.

FIG. 3A is a schematic cross-sectional view describing the operation of the dielectric layer of the first embodiment, and FIG. 3B is a schematic cross-sectional view of a comparative example.

Electric field concentration occurs near the first side surface 22b on the drain side of the gate electrode 22. The electric field is preferably made not more than the avalanche breakdown electric field. On the other hand, the length LFP of the field plate portion 22a has an upper limit due to the drain-gate capacitance. Therefore, there are limitations to increasing the length LFP of the field plate portion 22a to relax the electric field concentration.

As shown in the comparative example of FIG. 3B, electric field concentration is large in a portion of a surface 110a of a stacked body 110 near the lower portion of a side surface 220b of a gate electrode 220 (the portion surrounded by the dotted line). Therefore, it is difficult to increase the electric field near the first side surface 220b of the gate electrode 220 to almost approximately 3 MV/cm, which is the breakdown electric field of nitride-based materials.

In contrast, in the first embodiment, the dielectric layer having a relative permittivity higher than the relative permittivity of the surface 11a of the stacked body 11 is provided on the lower portion of the first side surface 22b of the gate electrode 22. Consequently, dielectric polarization occurs in the dielectric layer 24; and as shown in FIG. 3A, the spacing between equipotential lines VE is increased, and the peak electric field is decreased to increase the gate breakdown voltage more.

Thus, the length LFP of the field plate portion 22a can be made shorter than the length LFPP of a field plate portion 220a of the comparative example shown in FIG. 3B, and the drain-gate capacitance can be reduced.

In an FET using GaAs with a dielectric breakdown electric field of approximately 0.4 MV/cm, the three-terminal breakdown voltage (BVdsff) is generally approximately 30 V or less. In contrast, the drain voltage of the first embodiment can be set to an operating voltage corresponding to approximately 3 MV/cm, which is the dielectric breakdown electric field of nitride-based materials. That is, by providing the field plate portion 22a and the dielectric layer 24, the three-terminal breakdown voltage can be made 280 V or more. Therefore, in large signal operation, it is easy to suppress avalanche breakdown even when the peak voltage of the gate voltage or the drain voltage is, for example, approximately twice the direct current voltage. Furthermore, a leak current of the gate etc. can be suppressed.

Figure 4A:
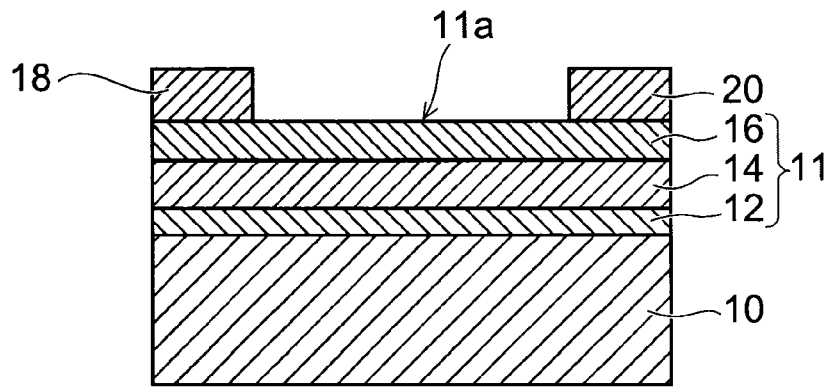
FIG. 4A is a cross-sectional view of a structure in which a source electrode and a drain electrode are provided on a stacked body.
Figure 4B:
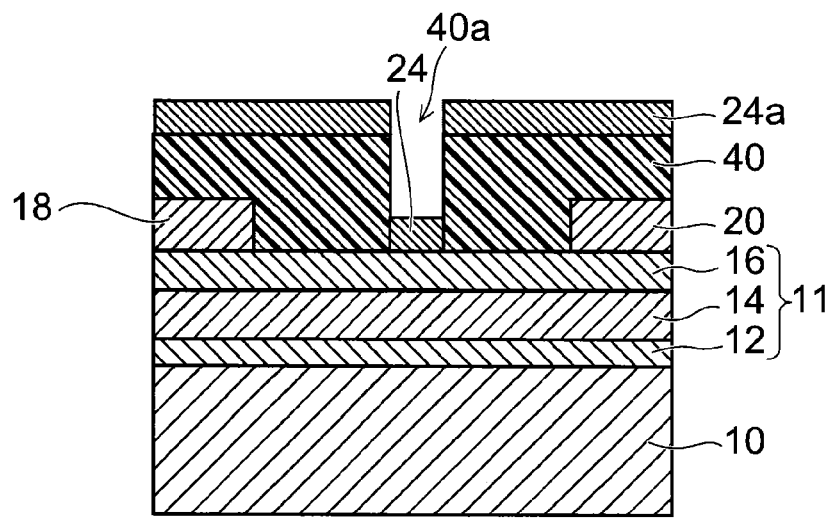
FIG. 4B is a cross-sectional view of a dielectric layer provided in an opening of a photoresist film.
Figure 4C:
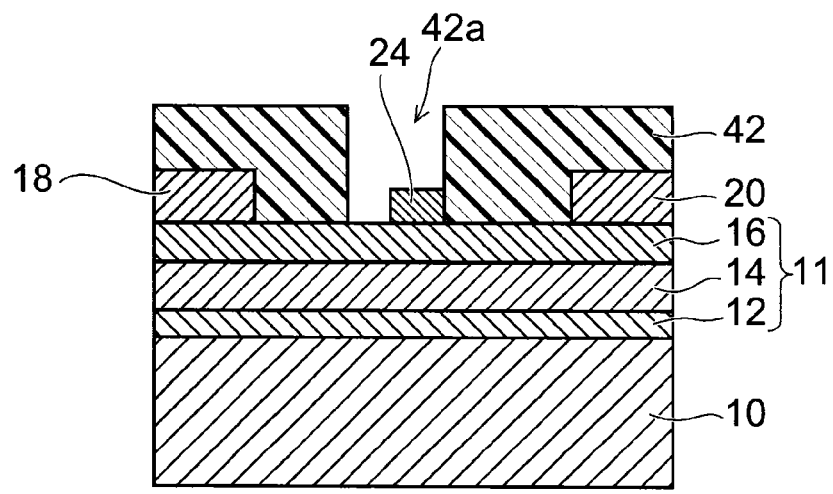
FIG. 4C is a cross-sectional view in which a photoresist having an opening in the gate electrode region is formed.

FIGS. 4A to 4C are schematic views describing a method for manufacturing a field effect transistor according to the first embodiment. That is, FIG. 4A is a cross-sectional view of a structure in which a source electrode and a drain electrode are provided on a stacked body, FIG. 4B is a cross-sectional view of a dielectric layer provided in an opening of a photoresist film, and FIG. 4C is a cross-sectional view in which a photoresist having an opening in the gate electrode region is formed.

As shown in FIG. 4A, the source electrode 18 and the drain electrode 20 are formed on the surface 11a of the stacked body 11. As shown in FIG. 4B, a photoresist film 40 is formed so as to cover the source electrode 18, the drain electrode 20, the dielectric layer 24, and the surface 11a of the stacked body 11. In the photoresist film 40, an opening 40a is provided so as to form the dielectric layer 24 on the surface 11a of the stacked body. The dielectric layer 24 is formed using the sputtering method or the like. The dielectric layer 24 may be made of, for example, $ZrO_2$, $HfO_2$, $TiO_2$, $Ta_2O_5$, or the like. The relative permittivity of the dielectric layer 24 is set higher than the relative permittivity of the surface of the stacked body 11 (in FIG. 4, the electron supply layer 16).

Subsequently, a photoresist film 42 is applied to the entire wafer surface. Further, as shown in FIG. 4C, an opening 42a is formed in the photoresist film 42 so that the dielectric layer 24 and a region of the surface 11a of the stacked body 11 where the gate electrode 22 is intended to be provided may be exposed.

Figure 5A:
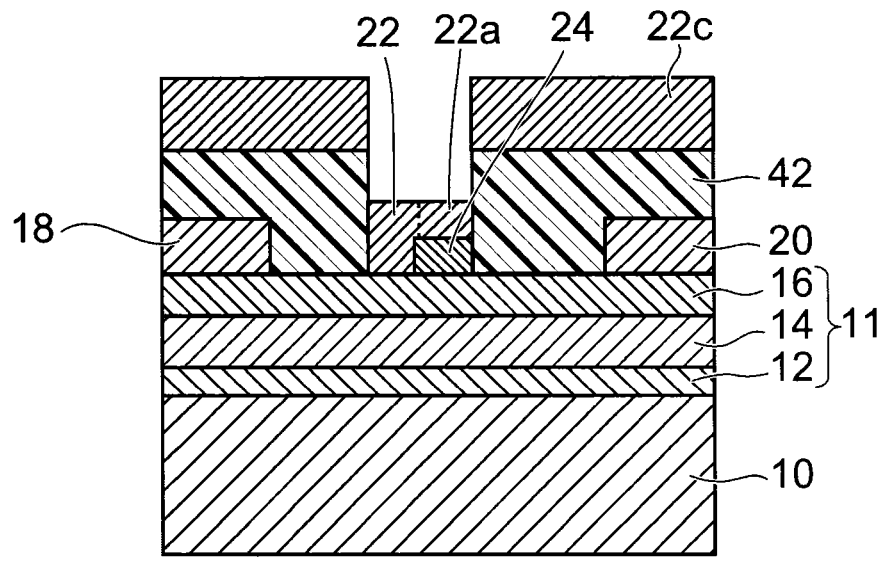
FIG. 5A is a cross-sectional view in which a gate electrode is formed.
Figure 5B:
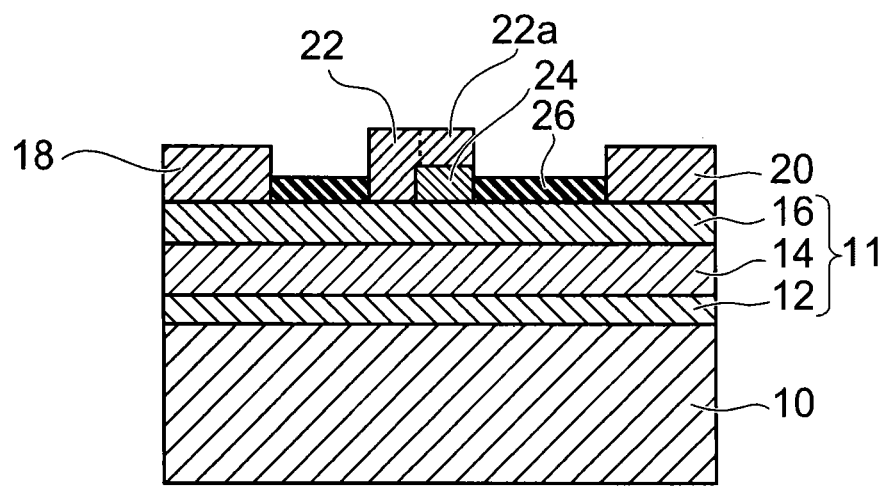
FIG. 5B is a cross-sectional view in which a silicon nitride layer is formed.

FIGS. 5A and 5B are schematic views describing the manufacturing method of the first embodiment. That is, FIG. 5A is a cross-sectional view in which a gate electrode is formed, and FIG. 5B is a cross-sectional view in which a silicon nitride layer is formed.

As shown in FIG. 5A, the gate electrode 22 including Ni (a Schottky electrode)/Au or the like is formed so as to cover the dielectric layer 24. The photoresist film 42 and a metal 22c on the upper surface thereof are removed. The gate electrode 22 has the field plate portion 22a on the upper surface of the dielectric layer 24.

As shown in FIG. 5B, the silicon nitride layer 26 is formed on the gate electrode 22 and the exposed surface 11a of the stacked body 11. $Si_3N_4$, for example, may be used as the silicon nitride layer 26. If the silicon nitride layer 26 is made thin, the relaxation of electric field concentration becomes easy, but the gate leak current is increased. Therefore, a thickness of 30 nm or more is preferable. On the other hand, if the silicon nitride layer 26 is made too thick, the surface charges are decreased, and the electric field becomes high between the gate electrode 22 and the drain electrode 20 to reduce the gate breakdown voltage. Furthermore, a crack of the film or deterioration over time of the film is likely to occur. Thus, the thickness of the silicon nitride layer 26 is set to, for example, 500 nm or less. The silicon nitride layer 26 may be left in other than the bonding pad portion of the gate electrode 22.

Figure 6:
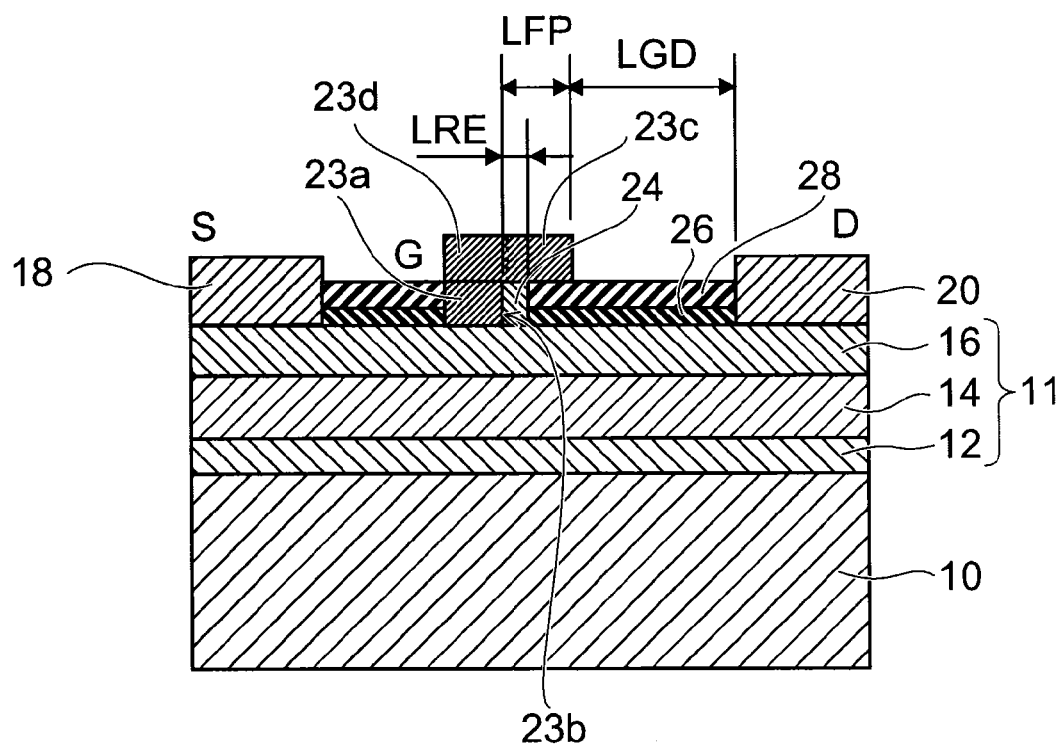
FIG. 6 is a field effect transistor according to a second embodiment.

FIG. 6 is a field effect transistor according to a second embodiment.

In the second embodiment, a protection layer 28 made of silicon oxide ($SiO_2$) or the like is provided so as to cover the silicon nitride layer 26. In the second embodiment, the thickness of the silicon nitride layer 26 is set to, for example, 100 nm or less, and a $SiO_2$ layer thicker than the silicon nitride layer 26 or the like is provided as the protection layer 28 on the silicon nitride layer 26. When the length LRE of the dielectric layer 24 is set not more than the length LFP of a field plate portion 23c, the drain-gate capacitance can be reduced while the electric field concentration near a first side surface 23b of a gate electrode 23 is relaxed. Consequently, the gate breakdown voltage can be increased while suppressing current collapse, and the reliability of the film quality of the silicon nitride layer 26 can be improved.

Figure 7A:
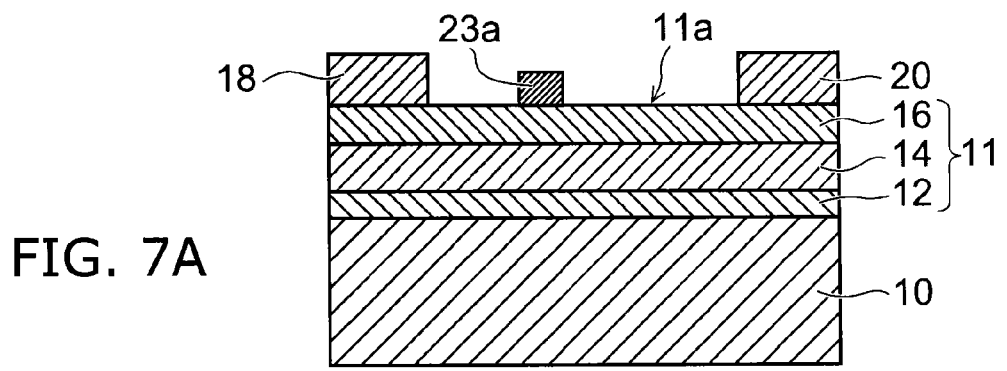
FIG. 7A is a cross-sectional view of a structure in which a source electrode, a drain electrode, and a gate electrode are provided on a stacked body.
Figure 7B:
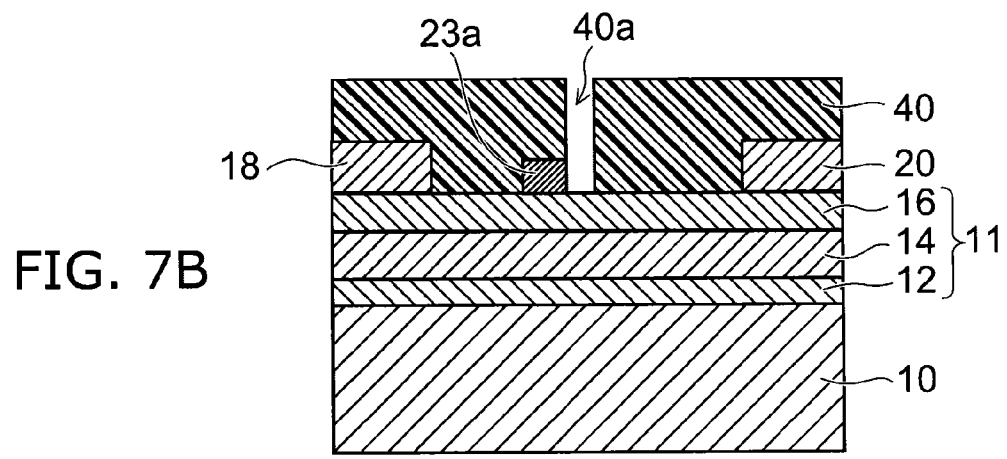
FIG. 7B is a cross-sectional view of a photoresist film provided with an opening.
Figure 7C:
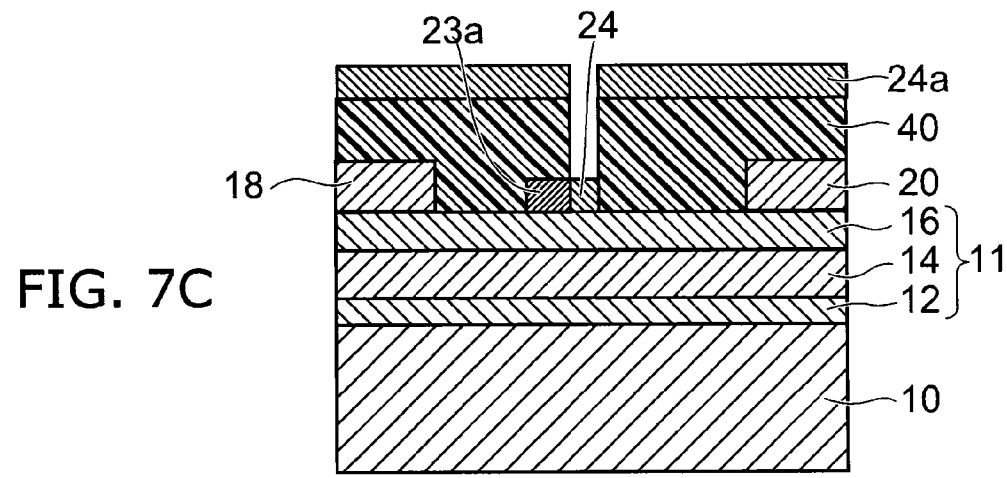
FIG. 7C is a cross-sectional view in which a dielectric layer is provided.
Figure 7D:
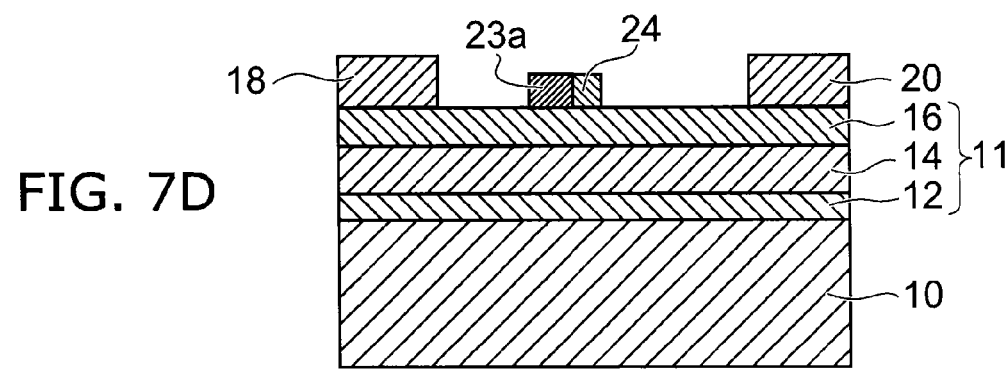
FIG. 7D is a cross-sectional view in which the photoresist film is removed.

FIGS. 7A to 7D are schematic views describing a method for manufacturing a field effect transistor according to the second embodiment. That is, FIG. 7A is a cross-sectional view of a structure in which a source electrode, a drain electrode, and a gate electrode are provided on a stacked body, FIG. 7B is a cross-sectional view of a photoresist film provided with an opening, FIG. 7C is a cross-sectional view in which a dielectric layer is provided, and FIG. 7D is a cross-sectional view in which the photoresist film is removed.

As shown in FIG. 7A, the source electrode 18, the drain electrode 20, and a lower gate electrode 23a are formed on the surface 11a of the stacked body 11. The lower gate electrode 23a containing at least Ni (a Schottky electrode) may be formed by the lift-off method or the like. The source electrode 18 and the drain electrode 20 may be formed by the same process, and either of this process and the lift-off process of the lower gate electrode 23a may be performed earlier than the other.

As shown in FIG. 7B, the photoresist film 40 is formed so as to cover the source electrode 18, the drain electrode 20, and the lower gate electrode 23a. Further, the opening 40a is formed in the photoresist film 40 so that the first side surface 23b of the lower gate electrode 23a may be exposed.

As shown in FIG. 7C, the dielectric layer 24 having a relative permittivity higher than the relative permittivity of the surface 11a of the stacked body 11 is formed. The dielectric layer 24 may be made of, for example, $ZrO_2$ (relative permittivity: 30 to 46), $HfO_2$ (relative permittivity: approximately 25), $TiO_2$ (relative permittivity: approximately 100), $Ta_2O_5$ (relative permittivity: 20 to 30), or the like. The height of the dielectric layer 24 and the height of the lower gate electrode 23a do not need to be the same, but are preferably set approximately the same.

As shown in FIG. 7D, the photoresist film 40 and the dielectric layer on the upper surface thereof are removed. Thus, the dielectric layer 24 of which a side surface is in contact with the first side surface of the lower gate electrode 23a is formed on the surface 11a of the stacked body 11.

Figure 8A:
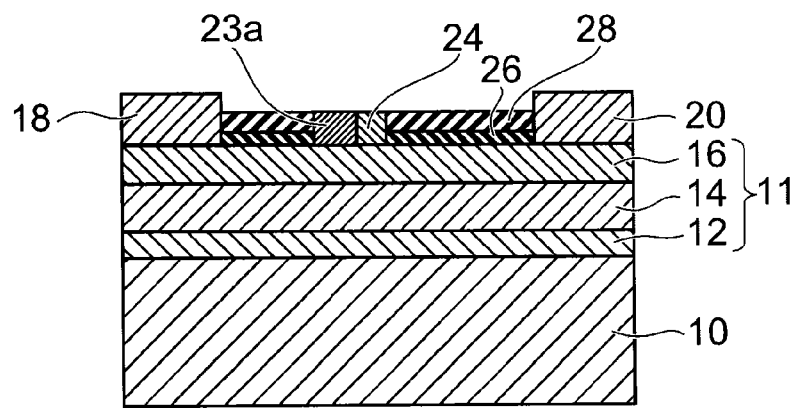
FIG. 8A is a cross-sectional view of a structure in which a silicon nitride layer and a protection film are formed.
Figure 8B:
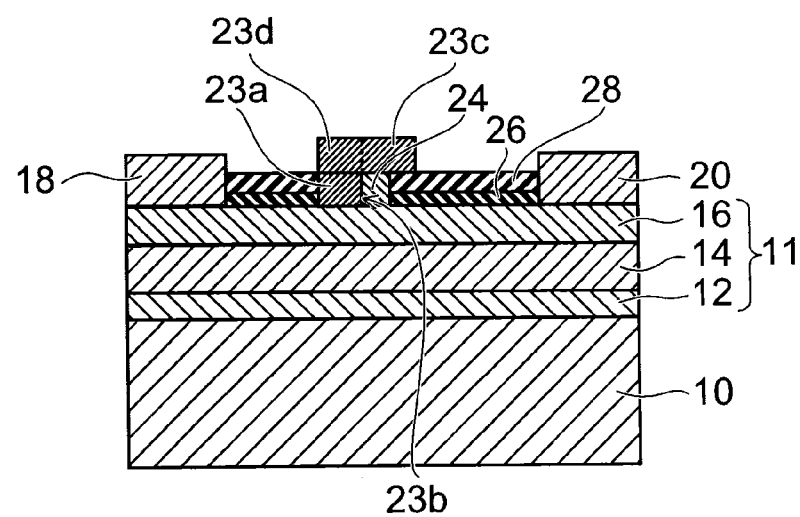
FIG. 8B is a cross-sectional view in which an upper gate electrode including a field plate portion is formed.

FIGS. 8A and 8B are schematic views describing the manufacturing method of the second embodiment. That is, FIG. 8A is a cross-sectional view of a structure in which a silicon nitride layer and a protection film are formed, and FIG. 8B is a cross-sectional view in which an upper gate electrode including a field plate portion is formed.

The silicon nitride layer 26 and a protection layer 28 made of $SiO_2$ (relative permittivity: approximately 3.9) or the like are formed so as to cover the exposed surface 11a of the stacked body 11, the upper surface of the lower gate electrode 23a, and the upper surface of the dielectric layer 24. Further, as shown in FIG. 8A, the upper surface of the lower gate electrode 23a, the upper surface of the dielectric layer 24, the upper surface of the source electrode 18, and the upper surface of the drain electrode 20 are exposed.

As shown in FIG. 8B, an upper gate electrode 23d made of Au or the like is formed on the upper surface of the lower gate electrode 23a and the upper surface of the dielectric layer 24. One portion of the upper gate electrode 23d forms the field plate portion 23c on the upper surface of the dielectric layer 24 and on one portion of the upper surface of the protection layer 28.

Figure 9:
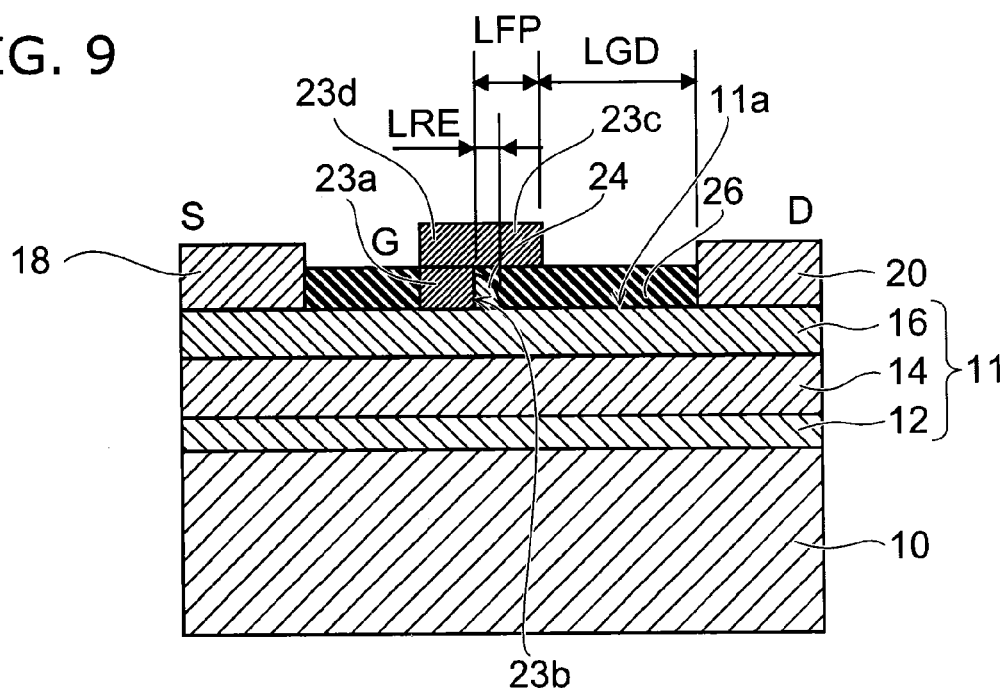
FIG. 9 is a schematic cross-sectional view of a field effect transistor according to a third embodiment.

FIG. 9 is a schematic cross-sectional view of a field effect transistor according to a third embodiment.

In the third embodiment, the dielectric layer 24 is provided so as to cover at least the intersection line of the first side surface 23b of the gate electrode 23a on the drain electrode 20 side and the surface 11a of the stacked body. In the cross section of the dielectric layer 24, the height from the surface 11a decreases as a distance from the first side surface of the gate electrode increases toward the drain electrode 20.

The electric field of the surface 11a of the stacked body 11 has a peak near the first side surface 23b. Therefore, when the dielectric layer 24 is provided in this region, the gate breakdown voltage can be effectively increased even when the length LRE of the dielectric layer 24 is short. Furthermore, when a region where the dielectric layer 24 is not provided is provided under the field plate portion 23c, the electric field on the drain electrode 20 side can be reduced to further increase the gate breakdown voltage. Thus, by reducing the volume of the dielectric layer 24, the drain-gate capacitance can be reduced. Consequently, the feedback capacitance between the input/output terminals can be reduced to increase the maximum stable power gain (MSG).

Figure 10A:
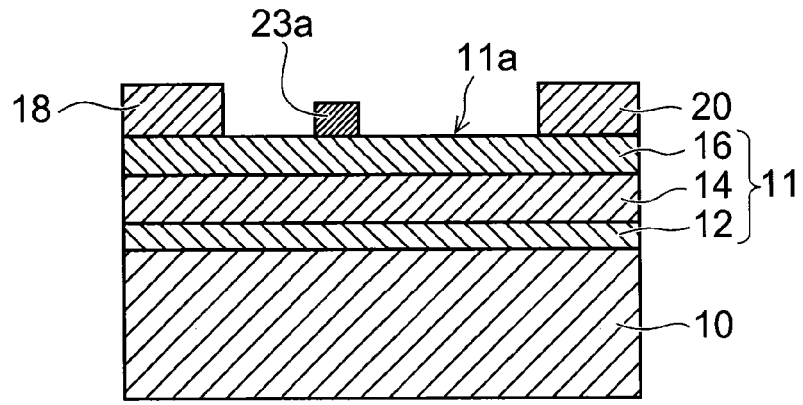
FIG. 10A is a cross-sectional view of a structure in which a source electrode, a drain electrode, and a gate electrode are provided on a stacked body.
Figure 10B:
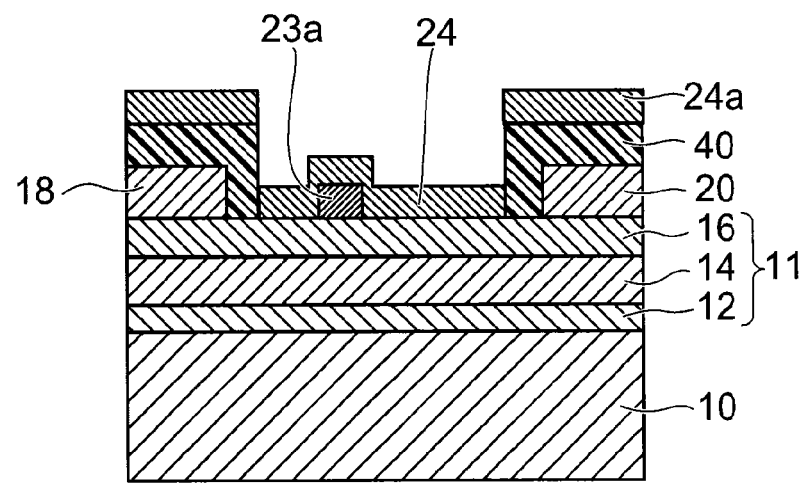
FIG. 10B is a cross-sectional view of a dielectric layer formed so as to cover the lower gate electrode.
Figure 10C:
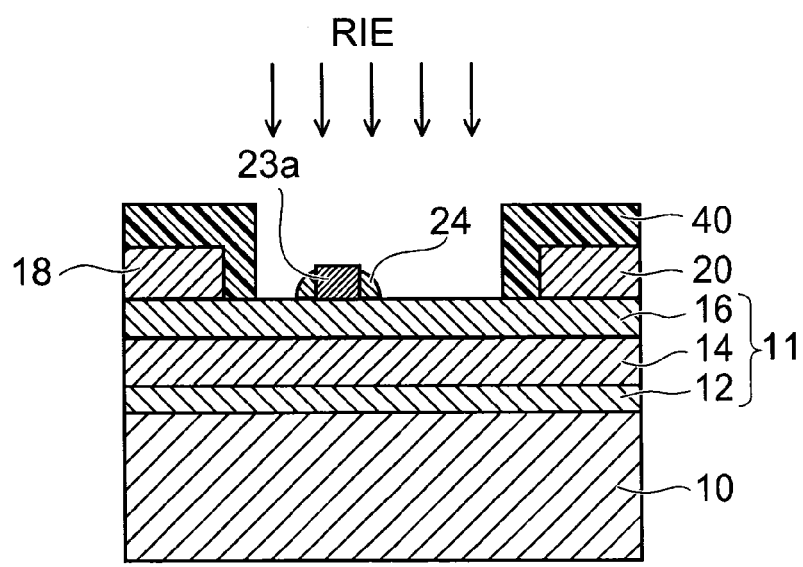
FIG. 10C is a cross-sectional view of a structure in which the dielectric layer is left on the side surface of the lower gate electrode.

FIGS. 10A to 10C are schematic views describing a method for manufacturing a field effect transistor according to the third embodiment. That is, FIG. 10A is a cross-sectional view of a structure in which a source electrode, a drain electrode, and a gate electrode are provided on a stacked body, FIG. 10B is a cross-sectional view of a dielectric layer formed so as to cover the lower gate electrode, and FIG. 10C is a cross-sectional view of a structure in which the dielectric layer is left on the side surface of the lower gate electrode.

As shown in FIG. 10A, the source electrode 18, the drain electrode 20, and the lower gate electrode 23a are provided on the surface 11a of the stacked body 11. As shown in FIG. 10B, the photoresist film 40 is formed so as to cover the source electrode 18 and the drain electrode 20. Further, the dielectric layer 24 is formed on the entire surface. The dielectric layer 24 may be made of, for example, $ZrO_2$, $HfO_2$, $TiO_2$, $Ta_2O_5$, or the like. The height of the dielectric layer 24 and the height of the lower gate electrode 23a may be the same, or the height of the dielectric layer 24 may be lower than the height of the lower gate electrode 23a.

As shown in FIG. 10C, anisotropic etching is performed using the RIE (reactive ion etching) method or the like. That is, etchback is performed so that the dielectric layer 24 may be left at least on a lower portion of the side surfaces of the lower gate electrode 23a, and the surface 11a of the stacked body 11 is exposed.

Figure 11A:
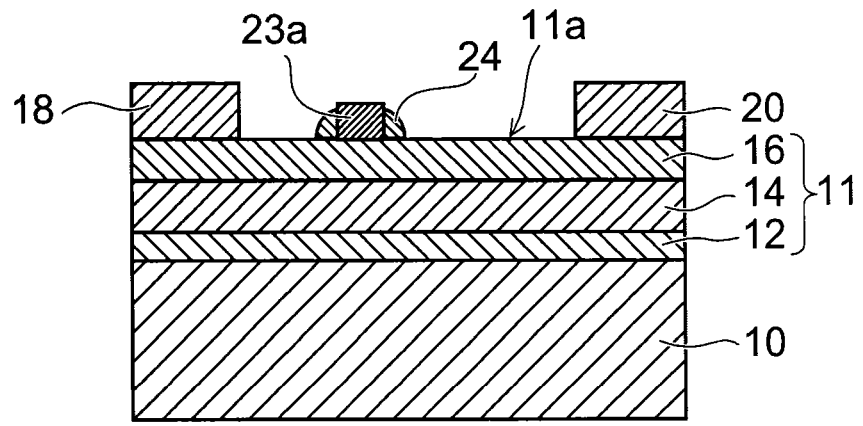
FIG. 11A is a cross-sectional view in which the photoresist film is removed.
Figure 11B:
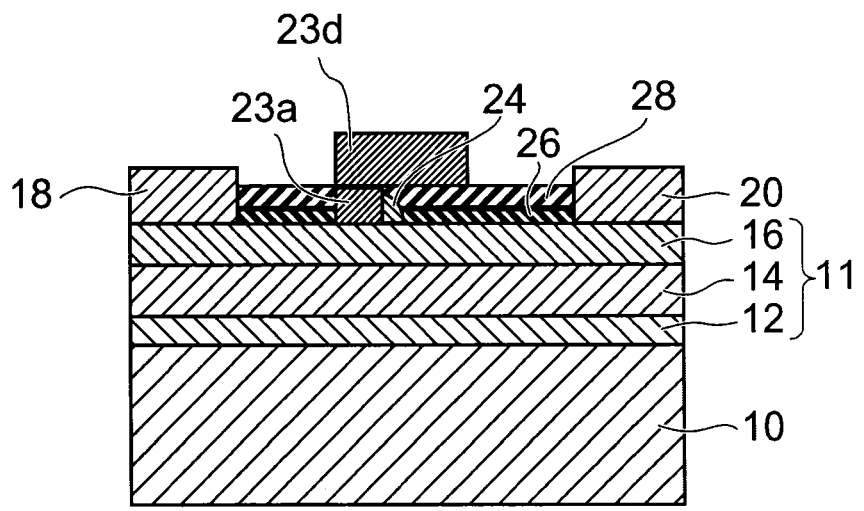
FIG. 11B is a cross-sectional view in which a silicon nitride layer, a protection layer made of $SiO_2$ or the like, and an upper gate electrode are formed.

FIGS. 11A and 11B are schematic views describing the manufacturing method of the third embodiment. That is, FIG. 11A is a cross-sectional view in which the photoresist film is removed, and FIG. 11B is a cross-sectional view in which a silicon nitride layer, a protection layer made of $SiO_2$ or the like, and an upper gate electrode are formed.

As shown in FIG. 11A, the photoresist film 40 is removed. Further, the dielectric layer on the source electrode 18 side is removed. As shown in FIG. 11B, the silicon nitride layer 26 and the protection layer 28 made of $SiO_2$ or the like are formed. Further, the upper gate electrode 23d is formed on the upper surface of the gate electrode 22 and the upper surface of the protection layer 28. By providing the upper gate electrode 23d, the gate resistance can be reduced. Furthermore, it becomes easy to increase the gate width (the sum total of the lengths in a direction parallel to line B-B of FIG. 2) to increase the saturation power.

Figure 12A:
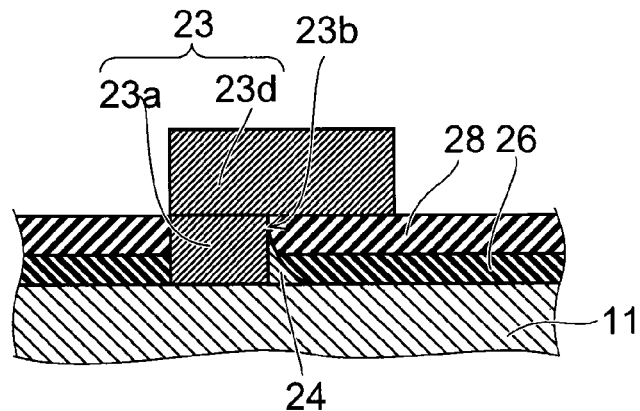
FIG. 12A is a first modification example of the third embodiment.
Figure 12B:
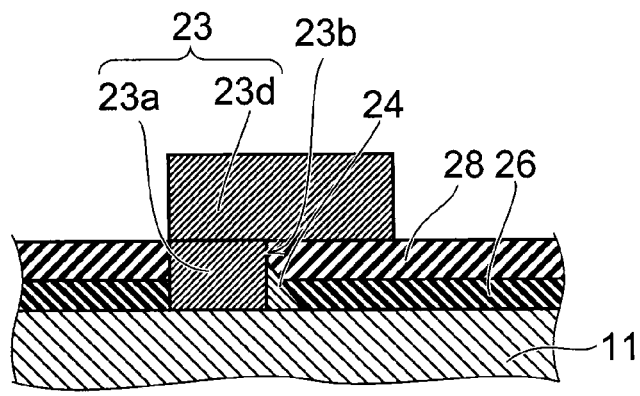
FIG. 12B is a second modification example.
Figure 12C:
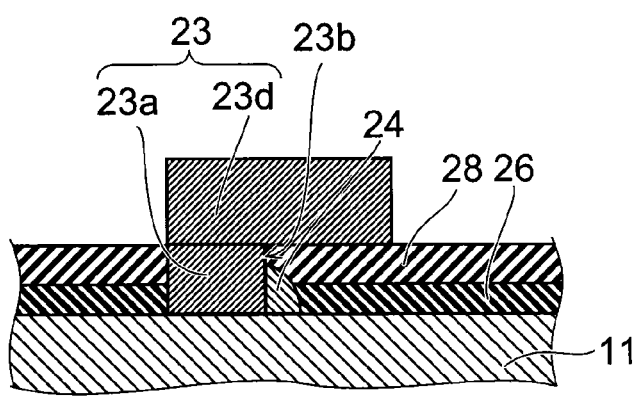
FIG. 12C is a third modification example.
Figure 12D:
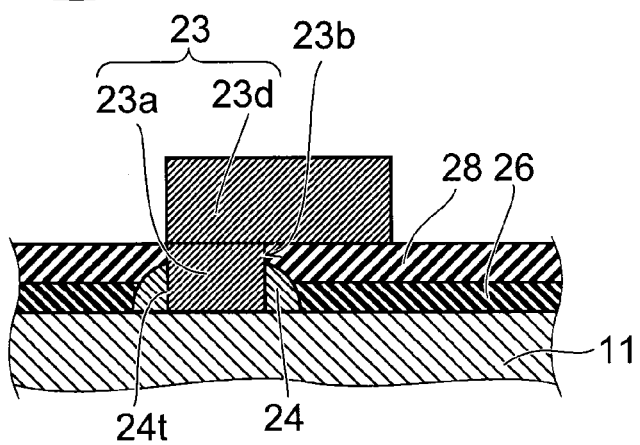
FIG. 12D is a fourth modification example.

FIG. 12A is a first modification example of the third embodiment, FIG. 12B is a second modification example, FIG. 12C is a third modification example, and FIG. 12D is a fourth modification example.

As shown in FIG. 12A, the cross section of the dielectric layer 24 can be made convex upward by etching conditions. As shown in FIG. 12B, the cross section may be a triangle.

As shown in FIG. 12C, the dielectric layer 24 may be provided only near the region where the electric field is highest. Furthermore, as shown in FIG. 12D, a dielectric layer 24t may be left on s side surface on the source electrode 18 side. Since the parasitic capacitance between the gate electrode 23 and the source electrode 18 is not a feedback capacitance, a decrease in the gain due to an increase in the feedback amount is not caused.

The field effect transistors according to the first to third embodiments can be used, for example, for a 2 GHz band high-power amplifier as a use of a mobile radio base station. In this case, an amplified output of 50 W or more can be obtained when the drain voltage Vds is 48 V (the power supply voltage of base stations). Furthermore, by shortening the gate length Lg etc., high-voltage, high-temperature operation can be performed even in a high frequency band.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A field effect transistor comprising:
   a stacked body including a channel layer and an electron supply layer, and made of a nitride semiconductor;
   a source electrode provided on a surface of the stacked body;
   a drain electrode provided on the surface of the stacked body;
   a gate electrode provided on the surface of the electron supply layer between the source electrode and the drain electrode and having a field plate portion, the gate electrode constituting a Schottky barrier to the electron supply layer;
   a dielectric layer provided so as to cover an intersection line of a first side surface of the gate electrode on the drain electrode side and the surface of the electron supply layer and having a relative permittivity higher than a relative permittivity of the surface of the electron supply layer; and
   a silicon nitride layer provided so as to cover a region between the source electrode and the gate electrode and a region between the dielectric layer and the drain electrode on the surface of the stacked body,
   the field plate portion provided above the dielectric layer to protrude from the first side surface of the gate electrode toward the drain electrode side.

2. The transistor according to claim 1, further comprising a source-side dielectric layer provided on a second side surface of the gate electrode on an opposite side of the first side surface and provided so as to cover an intersection line with the surface of the electron supply layer,
   the source-side dielectric layer being covered with the silicon nitride layer.

3. The transistor according to claim 1, wherein a length of the dielectric layer as viewed in a direction connecting the source electrode and the drain electrode is not more than a length of the field plate portion.

4. The transistor according to claim 3, wherein a height of the dielectric layer from the surface of the electron supply layer decreases as a distance from the first side surface of the gate electrode increases toward the drain electrode.

5. The transistor according to claim 4, wherein a cross section of the dielectric layer has one of an upward concave curve, a straight line, and an upward convex curve.

6. The transistor according to claim 4, wherein an upper end of the silicon nitride layer is in contact with the first side surface of the gate electrode.

7. The transistor according to claim 1, wherein the heterojunction is provided in a boundary region between the channel layer and the electron supply layer and generates a two-dimensional electron gas.

8. The transistor according to claim 1, wherein the dielectric layer is one of $ZrO_2$, $HfO_2$, $TiO_2$, and $Ta_2O_5$.

9. A field effect transistor comprising:
a stacked body having a heterojunction and made of a nitride semiconductor;
a source electrode provided on a surface of the stacked body;
a drain electrode provided on the surface of the stacked body;
a gate electrode provided on the surface of the stacked body between the source electrode and the drain electrode and having a field plate portion;
a dielectric layer provided so as to cover an intersection line of a first side surface of the gate electrode on the drain electrode side and the surface of the stacked body and having a relative permittivity higher than a relative permittivity of the surface of the stacked body;
a silicon nitride layer provided so as to cover a region between the source electrode and the gate electrode and a region between the dielectric layer and the drain electrode on the surface of the stacked body; and
a protection layer covering the silicon nitride layer and in contact with a lower surface of the field plate portion and a side surface of the dielectric layer,
the field plate portion protruding from the first side surface of the gate electrode toward the drain electrode side above the silicon nitride layer.

10. The transistor according to claim 9, further comprising a source-side dielectric layer provided on a second side surface of the gate electrode on an opposite side of the first side surface and provided so as to cover an intersection line with the surface of the stacked body,
the source-side dielectric layer being covered with at least the silicon nitride layer.

11. The transistor according to claim 9, wherein a length of the dielectric layer as viewed in a direction connecting the source electrode and the drain electrode is not more than a length of the field plate portion.

12. The transistor according to claim 11, wherein a height from the surface of the dielectric layer decreases as a distance from the first side surface increases toward the drain electrode.

13. The transistor according to claim 12, wherein a cross section of the dielectric layer has one of an upward concave curve, a straight line, and an upward convex curve.

14. The transistor according to claim 12, wherein an upper end of the protection layer is in contact with the first side surface of the gate electrode.

15. The transistor according to claim 9, wherein the protection layer is a silicon oxide layer.

16. The transistor according to claim 9, wherein the heterojunction is provided in a boundary region between a channel layer and an electron supply layer.

17. The transistor according to claim 9, wherein the dielectric layer is one of $ZrO_2$, $HfO_2$, $TiO_2$, and $Ta_2O_5$.

18. A field effect transistor comprising:
a stacked body made of $In_xGa_yAl_{1-x-y}N$ (0≤x≤1, 0≤y≤1, x+y≤1), a channel layer made of GaN and an electron supply layer made of $Al_sGa_{1-s}N$ (0<s<1) in the stacked body forming a heterojunction;
a source electrode provided on a surface of the stacked body;
a drain electrode provided on the surface of the stacked body;
a gate electrode provided on the surface of the electron supply layer between the source electrode and the drain electrode and having a field plate portion, the gate electrode constituting a Schottky barrier to the electron supply layer;
a dielectric layer provided so as to cover an intersection line of a first side surface of the gate electrode on the drain electrode side and the surface of the stacked body and having a relative permittivity higher than a relative permittivity on the surface of the electron supply layer; and
a silicon nitride layer provided so as to cover a region between the source electrode and the gate electrode and a region between the dielectric layer and the drain electrode of the surface of the electron supply layer,
the field plate portion provided above the dielectric layer to protrude from the first side surface of the gate electrode toward the drain electrode side.

* * * * *